United States Patent [19]

Mayer

[11] Patent Number: 4,473,292
[45] Date of Patent: Sep. 25, 1984

[54] DAMPENING SYSTEM

[75] Inventor: Herbert E. Mayer, Eschen, Liechtenstein

[73] Assignee: CENSOR Patent-und Versuchsanstalt, Vaduz, Liechtenstein

[21] Appl. No.: 347,320

[22] Filed: Feb. 9, 1982

[51] Int. Cl.³ .............................................. G03B 27/42
[52] U.S. Cl. ......................................... 355/53; 355/72
[58] Field of Search ................... 248/562, 636; 355/72, 355/73, 53

[56] References Cited

U.S. PATENT DOCUMENTS 3,107,752 10/1963 McLean .............................. 248/562
4,330,103 5/1982 Thuries et al. ...................... 248/636

FOREIGN PATENT DOCUMENTS 644469 4/1937 Fed. Rep. of Germany ...... 248/636
2231429 1/1973 Fed. Rep. of Germany ...... 248/636

OTHER PUBLICATIONS

Article "High-Viscosity Silicone Fluids for Mechanical Applications", *Product Engineering*, Jul. 1954.

*Primary Examiner*—Monroe H. Hayes
*Attorney, Agent, or Firm*—Ernest F. Marmorek

[57] ABSTRACT

In a dampening arrangement for oscillations occurring in rapidly stepwise displacements of a cross slide system of a circuit printing machine, the moving part is with one portion thereof immersed in a viscous dampening liquid within a cavity. Between the walls of the cavity and the outer surfaces of the immersed portion there is formed a small gap, the width of which is calculated by a special formula and which is in the range between $10\mu$ and $100\mu$, preferably between $25\mu$ and $60\mu$, and optimally about $40\mu$. Within this gap a friction between the moving part, the liquid layers, and the stationery surface occurs, so as to dampen any oscillations of the moving part in a short decay time.

10 Claims, 5 Drawing Figures

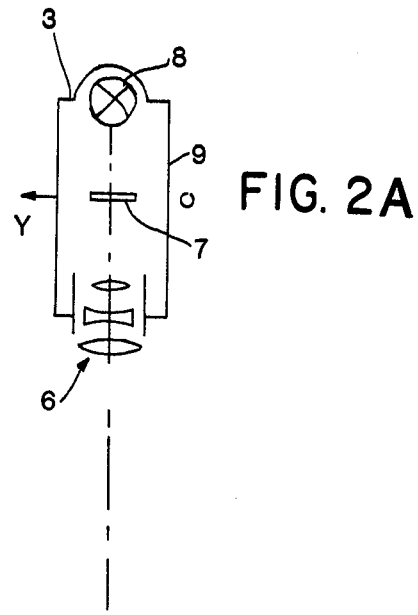
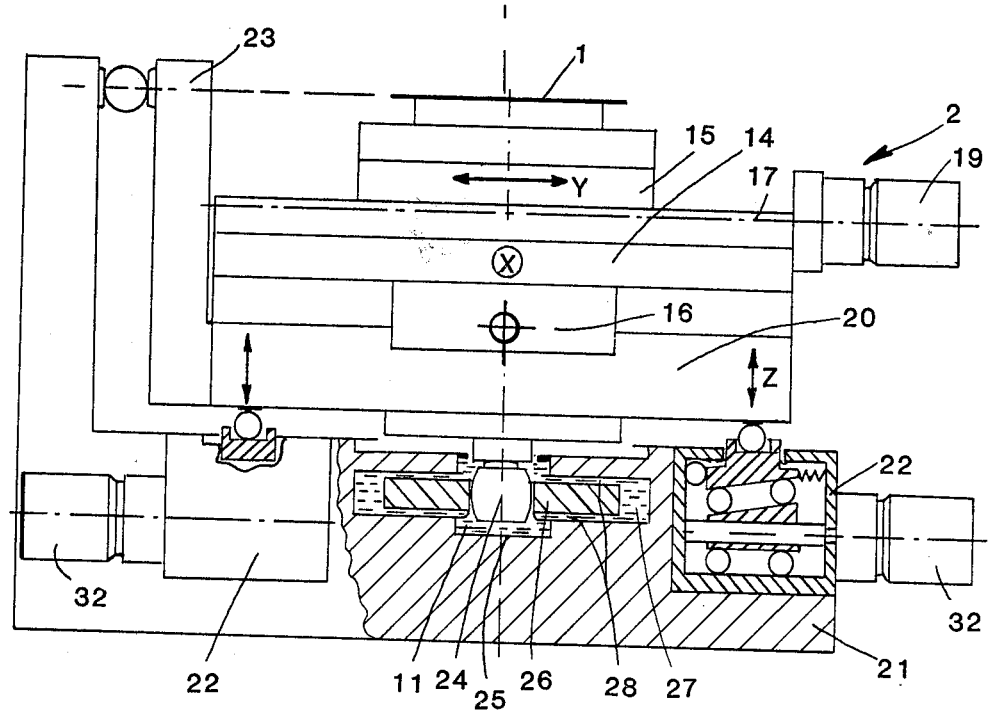

DAMPENING SYSTEM

BACKGROUND OF THE INVENTION

When manufacturing printed circuits, hybrid circuits or especially integrated circuits, a master mask is used for projecting the pattern of the circuit through an optical system. This may be, for example, a reducing system. The projection is made onto a photo-sensitive layer of a substrate or wafer. This layer is subsequently chemically and physically treated in order to obtain the desired circuits. Conventionally, there are projected onto the photo-sensitive layer several equal images of the mask in a side-by-side relationship to produce a corresponding number of circuits from one substrate or wafer. To this end, there is needed a stepwise relative movement of the projected image and the wafer, and this normally is done by a stepwise displacement of the wafer in its plane. The wafer is therefore mounted on a cross slide system which—after one image has been exposed thereonto—needs to be moved by one step (for example of the order of 10 mm) to project the pattern of the mask onto the adjacent area of the wafer. The individual steps must be carried out very quickly and with the highest precision because tolerances of more than $1\mu$ would cause a spoilage.

Machines of this kind have been described, for example, in U.S. Pat. Nos. 3,632,074 or 3,695,758 and in the applications Ser. Nos. 247,530; 247,614 and 247,639. Particularly in the DE-OS 2,942,388 the problems of positioning a wafer with the necessary precision have been described in detail.

With machines of relative low throughputs heretofore in use (as described in the above-mentioned references) achievement of such a precision posed no difficulty.

However, in order to obtain a higher efficiency it would be desirable to increase the production rate, and therefore the velocity of each stepwise displacement. It is, of course, to be understood that with an increasing velocity also higher accelerations and especially decelerations will occur. These sudden decelerations at the end of each step cause oscillations of the cross slide system, the amplitudes of which can exceed the admissable tolerances considerably, and consequently lead to greater spoilage due to image blurring. Thus the prior art evidences that it was not readily possible to raise the efficiency of such machines.

It is accordingly an object of the instant invention to provide measures for an increased efficiency of circuit printing machines.

It is furthermore an object of the invention to displace a cross slide system at higher speeds than has been possible heretofore without, however, increasing the spoilage.

Another object of this invention is an improved dampening device for such machines, in order to provide a higher displacement velocity of the wafer, and hence a decreased oscillation time.

BRIEF DESCRIPTION OF THE DRAWINGS

FIG. 2A is a schematic sectional view of the optical projection arrangement of the system of FIG. 1;

FIG. 2B is a side elevational view, partly in section of the cross slide system of FIG. 1;

DESCRIPTION OF THE PREFERRED EMBODIMENTS

Figure 1:
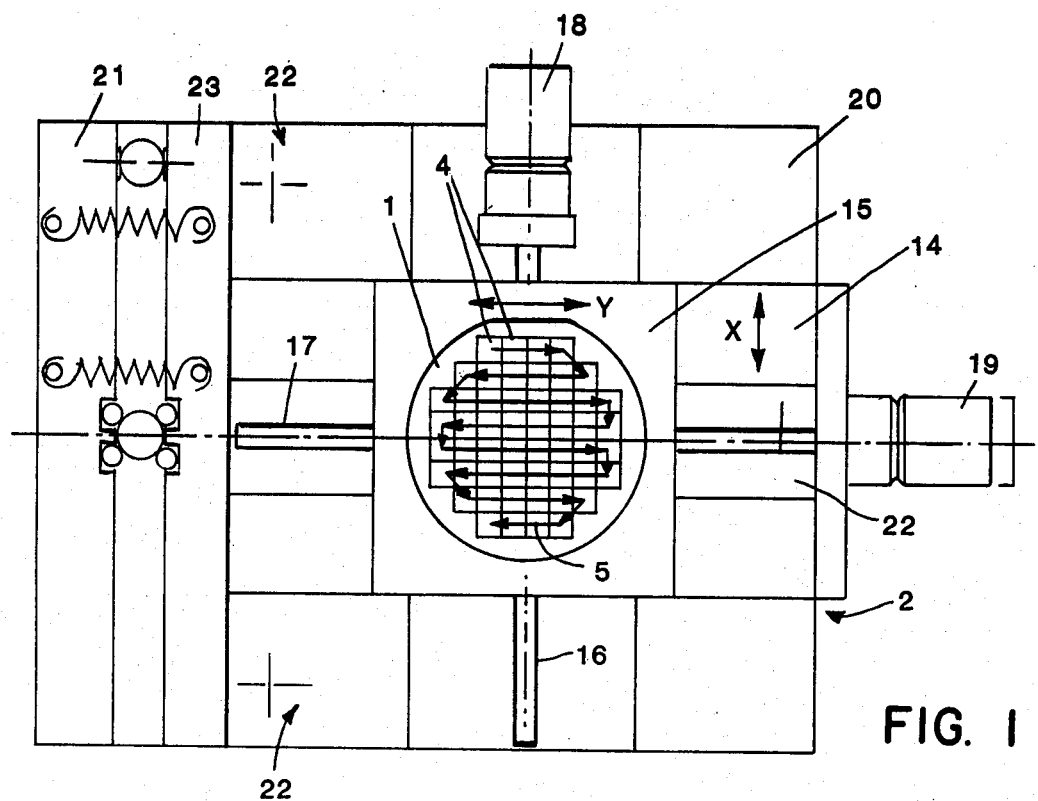
FIG. 1 is a plan view of a cross slide system with a wafer mounted thereon.

Referring now to the drawings, in FIG. 1, a wafer 1 is shown supported on a cross slide system 2. A projection system 6, best seen in FIG. 2A, projects images 4 from a mask onto the wafer 1, which is covered with a photo-sensitive layer. After exposure of one of the images 4, the cross slide system 2 is moved so as to project the next image 4 on an area adjacent the image already exposed. Thus, the cross slide system 2 performs a stepwise movement from one image area to the adjacent one in accordance with the arrows 5. In this way several images 4 are projected onto and exposed on each wafer 1, each image 4 containing a complete circuit pattern of a hybrid or of an integrated circuit.

From the foregoing it will be apparent that the adjacent images 4 must be located with great accuracy. In order to obtain higher production rates, however, it is necessary to move the cross slide system 2 at increased velocities. The necessarily high decelerations, however, lead to oscillations of the displaced parts, so that either the required precision and image acuity will not be achieved (which leads to an increased spoilage rate) or the oscillations must be allowed to decay, which decay time reduces the production rate.

Theoretically it is only necessary to provide a relative movement between the image and the wafer, and this could be done also by displacing parts of the projection system 3 which have a smaller mass with a consequently reduced tendency to oscillations. Thus, according to the embodiment of FIG. 2A, the housing 9 including the optical system and a mask 7, may be displaced in x and y directions in order to produce a stepwise movement of the images 4 as shown by the arrows 5 (FIG. 1). The images 4 are projected in a manner known per se from the pattern of the mask 7 by means of a light source 8 within a housing 9, and wherein the mask 7 is held free from dust by known means not shown. During movement of the lens or lenses of the optical system 6, the wafer 1 may be rigidly held in position.

The movements of different parts shown in FIGS. 1 and 2A could, of course, be combined so as to produce a series of images 4 on the wafer 1.

Although the parts shown in FIG. 2A, which could alternately be displaced, may have a smaller mass than the cross slide system 2 of FIG. 1, these parts are arranged within an optical range where the tolerance requirements are higher for optical reasons; in practice, therefore, better results are obtained by displacing a cross slide system 2 according to FIGS. 1 and 2B.

Nevertheless, all measures described in what follows for dampening the oscillations of the cross slide system 2 may also be applied in a corresponding manner to the moving parts shown in FIG. 2A, or generally to machines where a stepwise movement occurs.

The cross slide system 2 of FIGS. 1 and 2B comprises a carriage 14 for displacement in the x-direction; the carriage 14 in turn, carries a second carriage 15 thereon displaceable in the y-direction. Both carriages 14 and 15 are moved by drive means known per se, and comprise screw spindles 16 and 17, and a motor and gear assembly 18 and 19.

The motors may be stepping motors controlled for each displacement step by a series of pulses, preferably applied in accordance with a proportional-differential (PD) characteristic, or DC- servo-motors with angle encoders electronically controlled for each displacement step by control units known per se, for example, described in the application PCT/US80/00973, Publication No. WO87/00463.

Figure 3A:
FIG. 3A is a graph showing a time-displacement diagram.
Figure 3B:
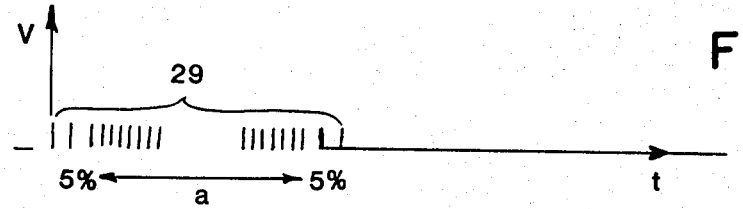
FIG. 3B is a diagramatic view of a series of pulses controlling the time displacement step shown in FIG. 3A.

To this end the respective stepping motors 18 or 19 are fed with pulses 29, which feature is only schematically illustrated in FIG. 3B. The interval between each pair of pulses over the major part of the displacement step (about 90%), namely within the middle portion a of the displacement step 29 is substantially constant. At the beginning and in a range of about 5% of each displacement step, as well as near the end thereof respectively, the intervals are increased, thus the carriage 14 or 15 approaches a desired end position 31 with diminished velocity, in order to avoid vibrations of the carriage about the end position 31, and consequently to diminish also any tendency to oscillations of the support structure 20. Nevertheless, with an increased displacement velocity the pulse intervals become very small, and when the last pulse is applied to the stepping motor 18 or 19 the carriage 14 or 15 reaches its end position at a start/stop velocity of the stepping motor carrying out its last step for completing one displacement step of the carriage.

The carriages 14 and 15 are held by two support structures 20 and 21; the support structure 21 is provided with three adjusting devices 22 known per se (only one is shown in detail in FIG. 2B) for adjusting the height of the support structure 20; the support structure 20 bears the cross slide system 2.

The carriages 14 and 15, as well as the support structures 20 and 21 are made to a high degree of precision, are very massive and therefore relatively heavy. Therefore, when carrying out the stepwise movements for displacing the images 4 relative to the wafer 1, micro-oscillations of the carriage bearing support 20 relative to the support structure 21 will occur, and additionally a small deformation of a slide arm 23 of the support structure 20 will take place. These deformations may be within the range of $1\mu$, and the micro-oscillations may need 300 to 2000 ms to die down into a harmless range below $0.1\mu$. This decay time, however, is unacceptably long.

It is impossible to dampen such micro-oscillations with known oil-hydraulic shock absorbers, in which oil is pressed through narrow nozzles, since such oscillations do not cause intense streams of the dampening fluid, as would be necessary to achieve the required dampening effect.

According to the invention, the carriage bearing support structure 20 is provided with an engaging member 24 extending into a central bore 25 of a ring shaped disk 26. The engaging member 24 within the range of the central bore 25 is preferably barrel-shaped, as best seen from FIG. 2B. The ring shaped disk 26 is located within a cylindrical cavity 27 and acts therein as a plunger. The cavity 27 is filled with a viscous liquid, preferably oil (such as silicone oil or even heavy oil), glycerin or a thixotrope liquid. The depth of the viscous liquid exceeds the width of the ring-shaped, plunger-like disk 26, so that an upper and and a lower gap 28 are formed. In principle these gaps 28 are dimensioned in such a way that any oscillatory or vibratory movement of the support structure 20 will cause a friction between the surfaces of the plunger-like disk 26, the liquid layers within the gaps 28, and the surfaces of the support structure 20. It has been found that this friction is able to dampen the micro-oscillations of the support structure 20 within a reasonable decay time, provided that the gaps 28 have a certain width.

In accordance with the invention, the optimum width d is calculated by the formula $$d = \frac{\eta \cdot f}{m \cdot u} \cdot K$$

where n is the viscosity of the liquid in centipoise, f is the part of the cavity surface area opposite corresponding portions of the disk 26 in square meters, m is the vibrating mass in kilograms, u is the initial speed of the oscillating movement in meters per second, and K is a constant measured in centimeters, having a value preferably within the range between 5 and 15 cm. By this formula, a range of the gap width between $10\mu$ and $100\mu$, preferably between $25\mu$ and $60\mu$, and optimally about $40\mu$, has been calculated. In this connection it is assumed that the ring-shaped plunger-like disk 26 is highly polished, and has a residual roughness of only a few $\mu$.

From FIG. 2B it will be understood that even if the depth of the cavity is measured so as to comply with the above-identified formula with respect to the height of the ring-shaped disk 26, this disk 26 will, in practice, sink to the bottom of the cavity 27 under its own weight, so that the lowermost gap 28 will have a smaller width than the uppermost gap 28. It has been found, however, that the width of the lower gap will never fall below the indicated ranges, so that an optimum dampening effect is maintained.

With such a dampening arrangement increased velocities have been achieved, so that each displacement step has a duration of only 130 ms. During this time the acceleration and the deceleration periods take up only 5% of the displacement stroke. The decay time has been reduced to between 50 and 200 ms.

It may be of interest that at smaller gaps than within the above mentioned range, the dampening effect is worsened in that the masses, when oscillating, after some initial oscillations, remains in one extreme position, from which it creeps slowly back into a balanced position, so that this end position is reached at a later time than had a wider gap 28 within the above-mentioned preferred range been used. Outside the indicated range the dampening effect is, however, considerably reduced.

In any case it is desirable to attain a decay time for the oscillations in the direction of the displacement of below 500 ms, and for the oscillations normal to the displacement direction of below 200 ms, by selecting the gap width d, the gap area f, and the viscosity n of the liquid used, accordingly for a given mass and velocity.

OPERATION

In operation, after each exposure, at least one of the stepping motors 18 or 19 is energized by program means not shown, and known per se in order to follow the arrow 5 of FIG. 1. After the new end position has been reached, the adjusting devices 22 are operated by motor and gear assemblies 32 for exactly positioning the wafer 1. This positioning operation is done in a similar way as described in the DE-AS 2,651,430, so that a further explanation is not necessary. After adjustment of the wafer 1 in x, y and z directions (see FIG. 2), the image can be exposed on the photo-sensitive layer of the wafer 1. Then the next displacement step can be started.

I wish it to be understood that I do not desire to be limited to the exact details of construction shown and described, for obvious modifications will occur to a person skilled in the art.

Having thus described the invention, what I claim as new and desire to be secured by Letters Patent is as follows:

1. In an integrated circuit printing apparatus adapted to use a light source for emitting light beams along a predetermined path, and including a holder on said path for holding a mask through which said light beams are to be projected; an optical projection system adapted to project said light beams onto a wafer; a support system for said wafer; a drive for providing a relative stepwise movement between said support system and said optical projection system; the improvement comprising:

means establishing an internal surface forming a cavity;

a viscous liquid within said cavity;

plunger means having an outer surface disposed opposite to, and conforming at least partially to said internal surface;

said internal and said outer surfaces being spaced substantially parallel from one another to from a gap of a predetermined width filled with said liquid;

said cavity forming means and said plunger means being moveable relative to each other, and one of said means being secured to one of said systems, the width d of said gap being set equal to $$d = \frac{\eta \cdot f}{m \cdot u} \cdot K, \text{ where}$$

where $\eta$ is the viscosity of the liquid in centipose;

f is the area of the internal surface of the cavity corresponding to the outer surface of the plunger means in square meters;

m is the mass of said one of said means in kilograms secured to one of said systems;

$\mu$ is the initial speed of said movement in centimeters per second; and

K is a factor in centimeters between 5 and 15.

2. The apparatus as claimed in claim 1, wherein said plunger means are connected to said support system, said support system including a cross slide system.

3. The apparatus as claimed in claim 1, wherein said liquid is selected from the group consisting of oil, glycerin and a thixotrope liquid.

4. The apparatus as claimed in claim 1, wherein said outer surface and said internal surfaces are plane surfaces.

5. The apparatus as claimed in claim 4, wherein said plunger means comprise a horizontally mounted disk having a top and bottom surface forming said outer surface of said plunger means.

6. The apparatus as claimed in claim 4, further comprising engaging means securing said one of said means to said one of said systems, and wherein said plunger means are provided with a bore receiving said engaging means, said engaging means being barrel-shaped within the range of said bore.

7. The apparatus as claimed in claim 6, wherein the width of said gap is between $25\mu$ and $65\mu$.

8. The apparatus as claimed in claim 1, wherein at least one of said surfaces is polished.

9. In an integrated-circuit printing apparatus adapted to use a light source for emitting light beams along a predetermined path, and including a holder means on said path for holding a mask through which said light beams are to be projected; an optical projection system adapted to project said light beams onto a wafer; a support system for said wafer; a drive means for providing a relative stepwise movement between said support system and said optical projection system; the improvement comprising:

means establishing an internal surface forming a cavity;

a viscous liquid within said cavity;

plunger means having an outer surface disposed opposite to, and confirming at least partially to said internal surface;

said internal and said outer surfaces being spaced substantially parallel from one another to form a gap of a predetermined width filled with said liquid;

said cavity forming means and said plunger means being moveable relative to each other, one of said means being secured to one of said systems;

the width of said gap being within the range of between $10\mu$ and $100\mu$.

10. The apparatus as claimed in claim 9, wherein the width of said gap is about $40\mu$, exclusive of a tolerance of $\pm 15\%$.

* * * * *